(12) United States Patent
Chen

(10) Patent No.: US 11,121,199 B1
(45) Date of Patent: Sep. 14, 2021

(54) DISPLAY PANEL AND MANUFACTURING METHOD FOR THE SAME

(71) Applicant: Wuhan China Star Optoelectronics Semiconductor Display Technology Co., Ltd., Hubei (CN)

(72) Inventor: Caiqin Chen, Hubei (CN)

(73) Assignee: WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 662 days.

(21) Appl. No.: 16/080,429

(22) PCT Filed: Jun. 8, 2018

(86) PCT No.: PCT/CN2018/090377
§ 371 (c)(1),
(2) Date: Aug. 28, 2018

(87) PCT Pub. No.: WO2019/227519
PCT Pub. Date: Dec. 5, 2019

(30) Foreign Application Priority Data

May 29, 2018 (CN) .......................... 201810533817.3

(51) Int. Cl.
*H01L 27/32* (2006.01)
*H01L 51/56* (2006.01)
*H01L 51/00* (2006.01)

(52) U.S. Cl.
CPC ...... *H01L 27/3258* (2013.01); *H01L 27/3276* (2013.01); *H01L 51/56* (2013.01);
(Continued)

(58) Field of Classification Search
CPC .. H01L 27/3258; H01L 27/3276; H01L 51/56
See application file for complete search history.

(56) References Cited

U.S. PATENT DOCUMENTS

2005/0140841 A1 6/2005 Yang et al.
2008/0035920 A1 2/2008 Takechi et al.
(Continued)

FOREIGN PATENT DOCUMENTS

| CN | 104795403 A | 7/2015 |
| CN | 106158882 A | 11/2016 |
| CN | 107658333 A | 2/2018 |

*Primary Examiner* — Douglas M Menz
(74) *Attorney, Agent, or Firm* — Leong C. Lei

(57) ABSTRACT

A display panel is provided. The display panel includes: a substrate having a display region and a bending region; a buffer layer having a first buffer layer disposed in the display region and a second buffer layer disposed in the bending region; a thin-film transistor disposed on the first buffer layer; an insulated combination layer disposed in the second buffer layer, a via hole is provided in the insulated combination layer and the second buffer layer; and a planarization layer disposed on the thin-film transistor and the insulated combination layer, and the planarization layer fills the via hole. A manufacturing method for a display panel is also disclosed. The present invention adopts an organic flat layer to fill the via hole, which can simplify the process flow and reduce the production cost while ensuring the flexibility of the bending region.

13 Claims, 3 Drawing Sheets

(52) U.S. Cl.
    CPC .... *H01L 51/0097* (2013.01); *H01L 2227/323* (2013.01); *H01L 2251/5338* (2013.01)

(56) References Cited

U.S. PATENT DOCUMENTS

| | | | |
|---|---|---|---|
| 2017/0317299 A1* | 11/2017 | Choi | H01L 27/3276 |
| 2019/0013369 A1* | 1/2019 | Bu | H01L 51/56 |
| 2019/0131368 A1* | 5/2019 | Zhang | H01L 51/56 |
| 2019/0245156 A1* | 8/2019 | Kwon | H01L 51/0097 |
| 2020/0105859 A1* | 4/2020 | Lee | H01L 27/3276 |
| 2020/0343324 A1* | 10/2020 | Zhang | H01L 51/0097 |

* cited by examiner and manufacturing method for the same

RELATED APPLICATIONS

The present application is a National Phase of International Application Number PCT/CN2018/090377, filed Jun. 8, 2018, and claims the priority of China Application No. 201810533817.3, filed May 29, 2018.

FIELD OF THE INVENTION

The present invention relates to a display technology field, and more particularly to a display panel and manufacturing method for the same.

BACKGROUND OF THE INVENTION

With the development of the optoelectronic and semiconductor technology, flat panel display is greatly developed. The conventional flat panel display mainly includes a liquid crystal display and an organic light emitting diode display (AMOLED).

The AMOLED includes rigid AMOLED and flexible AMOLED. Bendable and flexible AMOLEDs give users a disruptive experience.

However, the current flexible display technology is not mature enough and the process is more complicated. In order to improve the stress and flexibility of bending regions of the flexible AMOLED, the conventional flexible AMOLED fabrication process requires etching the inorganic film with poor stress and poor flexibility in the bending regions and then filled with PI (polyimide) material having better flexibility. The fabrication process of the flexible AMOLED requires multiple exposure processes, and one mask is required for each exposure process. However, the mask has a relatively high price, which accounts for a relatively high cost in the manufacture process of the flexible AMOLED.

SUMMARY OF THE INVENTION

In order to solve the problems in the prior art, the present invention provides a display panel that can simplify the manufacturing process and a manufacturing method thereof.

In order to achieve the above object of the invention, the present invention adopts the following technical solutions:

According to one aspect of the present invention, providing a display panel, comprising: a substrate having a display region and a bending region; a buffer layer having a first buffer layer disposed in the display region and a second buffer layer disposed in the bending region; a thin-film transistor disposed on the first buffer layer; an insulated combination layer disposed in the second buffer layer, a via hole is provided in the insulated combination layer and the second buffer layer; and a planarization layer disposed on the thin-film transistor and the insulated combination layer, and the planarization layer fills the via hole.

Wherein the thin-film transistor comprises: an active layer disposed on the first buffer layer; a first insulation layer disposed on the active layer and the first buffer layer, and the first insulation layer is extended into the bending region; a gate electrode disposed on the first insulation layer; a second insulation layer disposed on the gate electrode and the first insulation layer, and the second insulation layer is extended into the bending region; a capacitor electrode disposed on the second insulation layer and is opposite to the gate electrode; an interlayer insulation layer disposed on the capacitor electrode and the second insulation layer, and the interlayer insulation layer is extended into the bending region; a source electrode and a drain electrode disposed on the interlayer insulation layer, wherein the source electrode and the drain electrode penetrate the interlayer insulation layer, the second insulation layer, and the first insulation layer to respectively contact with the active layer; wherein the insulated combination layer is formed by the interlayer insulation layer, the second insulation layer, and the first insulation layer extended to the bending region.

Wherein the display panel further includes a trace disposed on the planarization layer in the bending region.

Wherein the via hole includes a first via hole that penetrates the interlayer insulation layer and the second insulation layer and multiple second via holes that penetrate the first insulation layer and the second buffer layer by extending from a bottom of the first via hole; wherein the display panel further includes a trace disposed on the first insulation layer between two adjacent second vias holes.

Wherein the via hole includes a first via hole that penetrates the interlayer insulation layer and multiple second via holes that penetrates the second insulation layer, the first insulation layer, and the second buffer layer by extending from the bottom of the first via hole.

Wherein the display panel further comprises: an anode disposed on the planarization layer, and the anode penetrates the planarization layer to connect with the thin-film transistor; a pixel definition layer disposed on the anode and the planarization layer, wherein the pixel definition layer has a pixel definition hole exposing the anode; an organic light-emitting layer disposed on the anode; and a cathode disposed on the organic light-emitting layer.

According to another aspect of the present invention, providing a manufacturing method for a display panel, comprising steps of providing a substrate having a display region and a bending region; forming a buffer layer on the substrate, wherein the buffer layer includes a first buffer layer located in the display region and a second buffer layer located in the bending region; forming a thin-film transistor on the first buffer layer, and simultaneously forming an insulated combination layer on the second buffer layer; forming a via hole in the insulated combination layer and the second buffer layer; and forming a planarization layer on the thin-film transistor and the insulated combination layer, wherein the planarization layer fills the via hole.

Wherein the step of forming a thin-film transistor on the first buffer layer comprises steps of forming an active layer on the first buffer layer; forming a first insulation layer on the active layer and the first buffer layer, wherein the first insulation layer is extended into the bending region; forming a gate electrode on the first insulation layer; forming a second insulation layer on the gate electrode and the first insulation layer, wherein the second insulation layer is extended into the bending region; forming a capacitor electrode on the second insulating layer and opposite to the gate electrode; forming an interlayer insulation layer on the capacitor electrode and the second insulation layer, wherein the interlayer insulation layer is extended into the bending region; forming a source electrode and a drain electrode on the interlayer insulation layer, wherein the source electrode and the drain electrode penetrate the interlayer insulation layer, the second insulation layer, and the first insulation layer to contact with the active layer; wherein, the interlayer insulation layer, the second insulation layer, and the first insulation layer which are extended into the bending region form the insulated combination layer.

Wherein the method further comprises a step of forming a trace on the planarization layer located in the bending region.

Wherein the method further comprises a step of forming a trace on the planarization layer located in the bending region.

Wherein the method further comprises steps of: when performing the step of forming a gate electrode on the first insulation layer, forming the trace on the first insulation layer located in the bending region; the method of forming the via hole in the insulated combination layer and the second buffer layer includes: forming a first via hole in the interlayer insulation layer and the second insulation layer, and forming multiple second via holes located in the first insulation layer and the second buffer layer and extended to a bottom of the first via hole.

Wherein the method further comprises steps of: when performing the step of forming capacitor electrode on the second insulation layer, forming the trace on the second insulation layer located at the bending region; the method of forming the via hole in the insulated combination layer and the second buffer layer includes: forming a first via hole in the interlayer insulation layer, and forming multiple second via hole in the second insulation layer, the first insulation layer and the second buffer layer, and the multiple second via holes are extended to a bottom of the first via hole.

Additional aspects and/or advantages of the invention will be set forth in part in the following description, or will be obvious from the description, or may be known by implementation of the present invention.

BRIEF DESCRIPTION OF THE DRAWINGS

The above and/or other objects and advantages of the present invention will become more apparent from the following description of embodiments in conjunction with the accompanying drawings, wherein.

DETAILED DESCRIPTION OF PREFERRED EMBODIMENTS

Figure 1:
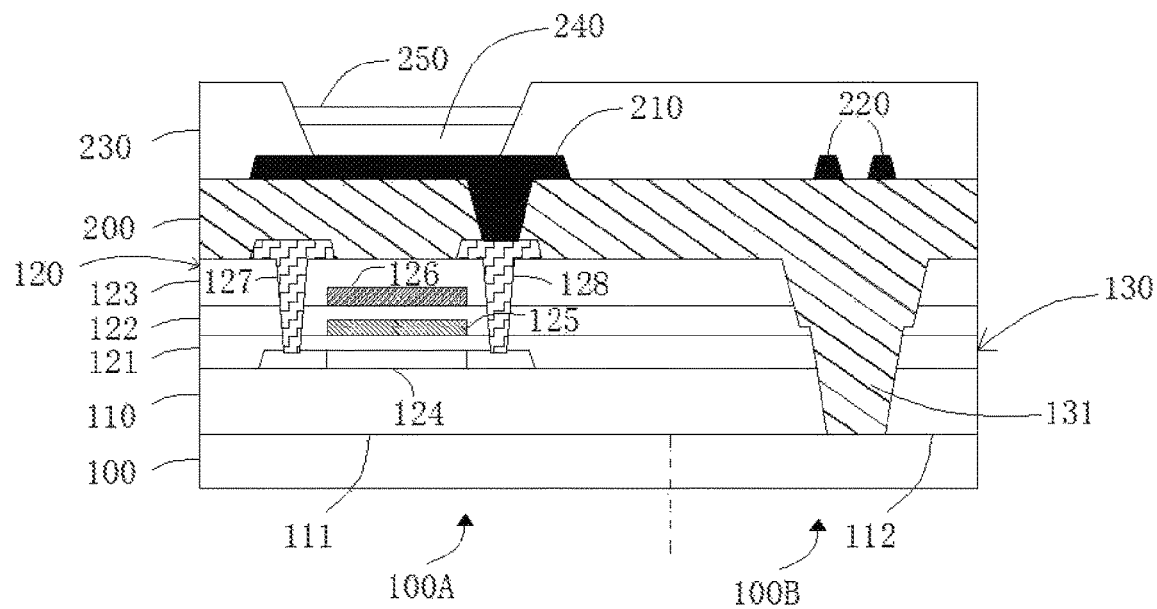
FIG. 1 is a schematic structural diagram of a display panel according to a first embodiment of the present invention.

Hereinafter, embodiments of the present invention will be described in detail with reference to the accompanying drawings. In the drawings, the main elements relating to the inventive concept are clearly and concisely illustrated, the shapes of the layers or regions may be exaggerated, and minor elements may be omitted in order to avoid obscuring the description. Throughout the drawings, same reference numerals refer to same elements throughout. However, the present invention is not limited to the following examples. Features, elements, or structures involved in various embodiments or corresponding method descriptions may be applied to other embodiments alone or in combination.

It will be understood that when an element such as a layer, film, region, or substrate is referred to as being "on" or "formed on" another element, it can be directly on or formed on the other element. Or, there may also be intermediate components. Alternatively, when an element is referred to as being "directly on" or "directly formed on" another element, there are no intermediate elements.

First Embodiment

FIG. 1 is a schematic structural diagram of a display panel according to a first embodiment of the present invention.

Referring to FIG. 1, the first embodiment of the present invention provides a display panel. The display panel includes a substrate 100, a buffer layer 110, a thin-film transistor layer 120, an insulated combination layer 130, and a planarization layer 200. However, it is to be understood that the present invention is not limited thereto, and a display panel according to an embodiment of the present invention may further include other necessary components.

Specifically, the substrate 100 includes a display region 100A and a bending region 100B.

The buffer layer 110 is disposed on the substrate 100. The buffer layer 110 includes a first buffer layer 111 disposed in the display region 100A and a second buffer layer 112 disposed in the bending region 100B.

The thin-film transistor 120 is disposed on the first buffer layer 111. As an embodiment of the present invention, the thin-film transistor 120 includes an active layer 124, a first insulation layer 121, a gate electrode 125, a second insulation layer 122, a capacitor electrode 126, an interlayer insulation layer 123, a source electrode 127, and a drain electrode 128.

Specifically, the active layer 124 is disposed on the first buffer layer 111. The first insulation layer 121 is disposed on the active layer 124 and the first buffer layer 121, and the first insulation layer 121 is extended into the bending region 100B. The gate electrode 125 is disposed on the first insulation layer 121. In this embodiment, the gate electrode 125 can also be used as a second capacitor electrode to form a storage capacitor (not shown) with the first capacitor electrode 126. The second insulation layer 122 is disposed on the gate electrode 125 and the first insulation layer 121, and the second insulation layer 122 is extended into the bending region 100B. The capacitor electrode 126 is disposed on the second insulation layer 122 and is opposite to the gate electrode 125. An interlayer insulation layer 123 is disposed on the capacitor electrode 126 and the second insulation layer 122, and the interlayer insulation layer 123 is extended into the bending region 100B. The source electrode 127 and the drain electrode 128 are disposed on the interlayer insulation layer 123. The source electrode 127 and the drain electrode 128 penetrate the interlayer insulation layer 123, the second insulation layer 122, and the first insulation layer 121 to respectively contact with the active layer 124.

As one embodiment of the present invention, the insulated combination layer 130 is formed by the interlayer insulation layer 123, the second insulation layer 122, and the first insulation layer 121 extended to the bending region 100B.

Specifically, a via hole 131 is provided in the insulated combination layer 130 and the second buffer layer 112.

Specifically, the planarization layer 200 is disposed on the thin-film transistor 120 and the insulated combination layer 130, and the planarization layer 200 fills the via hole 131. The planarization layer 200 is made of an organic material.

In the embodiment of the invention, the via hole 131 removes the material of poor stress and poor flexibility of the insulated combination layer 130 and the second buffer layer 112, and is filled with the planarization layer 200 made of an organic material. Thus, the stress and flexibility of the display panel in the bending region 100B are increased.

As an embodiment of the present invention, the display panel further includes an anode 210. The anode 210 is disposed on the planarization layer 200, and the anode 210 penetrates the planarization layer 200 to connect with the thin-film transistor 120. The pixel definition layer 230 is disposed on the anode 210 and the planarization layer 200. The pixel definition layer 230 has a pixel definition hole exposing the anode 210. The organic light-emitting layer 240 is disposed on the anode 210. The cathode 250 is disposed on the organic light-emitting layer 240.

As an embodiment of the present invention, the display panel further includes a trace 220. In this embodiment, the trace 220 is disposed on the planarization layer 200 in the bending region 100B. The trace 220 and the anode 210 are located in the same layer and can be simultaneously manufactured by a same exposure and development process.

Second Embodiment

Figure 2:
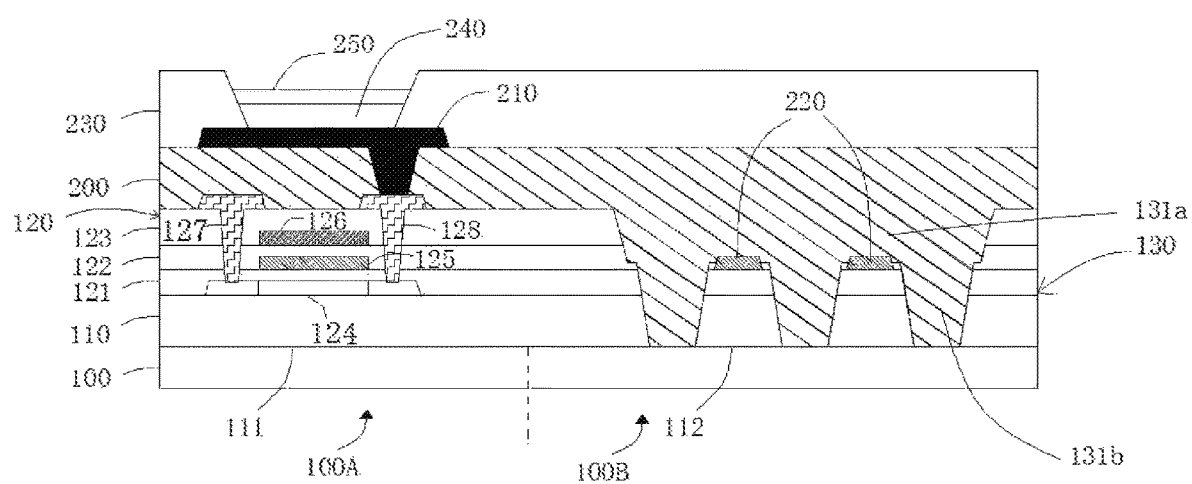
FIG. 2 is a schematic structural diagram of a display panel according to a second embodiment of the present invention.

FIG. 2 is a schematic structural diagram of a display panel according to a second embodiment of the present invention.

Referring to FIG. 2, the difference between the display panel proposed in the second embodiment of the present invention and the first embodiment is that the via hole 131 of the second embodiment of the present invention includes a first via hole 131a that penetrates the interlayer insulation layer 123 and the second insulation layer 122 and multiple second via holes 131b that penetrate the first insulation layer 121 and the second buffer layer 112 by extending from a bottom of the first via hole 131a. As an embodiment of the present invention, one first via hole 131a is provided, and three second via holes 131b that penetrate the first insulation layer 121 and the second buffer layer 112 by extending from the bottom of the first via hole 131a.

In this embodiment, the trace 220 is disposed on the first insulation layer 121 between two adjacent second vias holes 131b. As an embodiment of the present invention, two traces 220 are provided. The two traces 220 are distributed on the first insulation layer 121 between two adjacent second via holes 131b of the three second via holes 131b. The first via hole 131a penetrates the interlayer insulation layer 123 and the second insulation layer 122 above the trace 220.

In the embodiment of the invention, the trace 220 and the gate electrode 125 are located in the same layer and can be simultaneously manufactured by a same exposure and development process. The first via hole 131a and the second via hole 131b do not damage the trace 220, and also greatly remove the material with poor stress and poor flexibility in the bending region 100B, and are replaced by the planarization layer 200 made of organic material, which can increase the stress and flexibility of the display panel in the bending region 100B.

Third Embodiment

Figure 3:
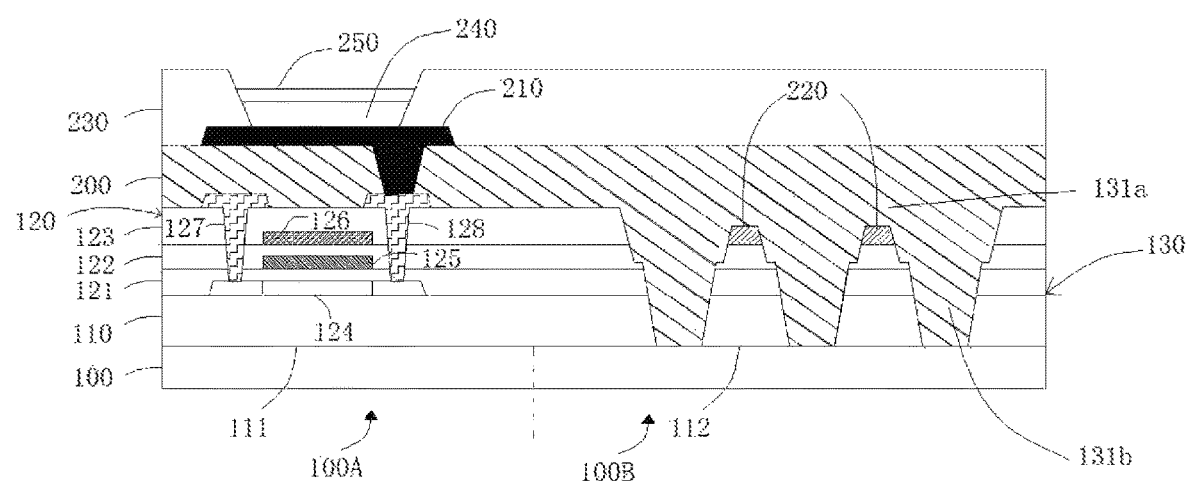
FIG. 3 is a schematic structural diagram of a display panel according to a third embodiment of the present invention.

FIG. 3 is a schematic structural diagram of a display panel according to a third embodiment of the present invention.

Referring to FIG. 3, the display panel proposed in the third embodiment of the present invention is different from the first embodiment and the second embodiment in that the via hole in the third embodiment of the present invention includes a first via hole 131a that penetrates the interlayer insulation layer 123 and multiple second via holes 131b that penetrates the second insulation layer 122, the first insulation layer 121, and the second buffer layer 112 by extending from the bottom of the first via hole 131a. As an embodiment of the present invention, one first via hole 131a is provided, and two second via holes 131b that penetrate the second buffer layer 112 and by extending from the bottom of the first via hole 131a.

In this embodiment, the trace 220 is disposed on the second insulation layer 122 between two adjacent second via holes 131b. As an embodiment of the present invention, two traces 220 are provided. The two traces 220 are distributed on the second insulation layer 122 between two adjacent second via holes 131b of the three second via holes 131b. The first via hole 131a penetrates the interlayer insulation layer 123, the second insulation layer 122 and the first insulation layer 121 above the trace 220.

In the embodiment of the invention, the trace 220 and the capacitor electrode 126 are located in the same layer and can be simultaneously manufactured by a same exposure and development process. The first via hole 131a and the second via hole 131b do not damage the trace 220, and also greatly remove the material with poor stress and poor flexibility in the bending region 100B, and are replaced by the planarization layer 200 made of organic material, which can increase the stress and flexibility of the display panel in the bending region 100B.

Fourth Embodiment

Figure 4:
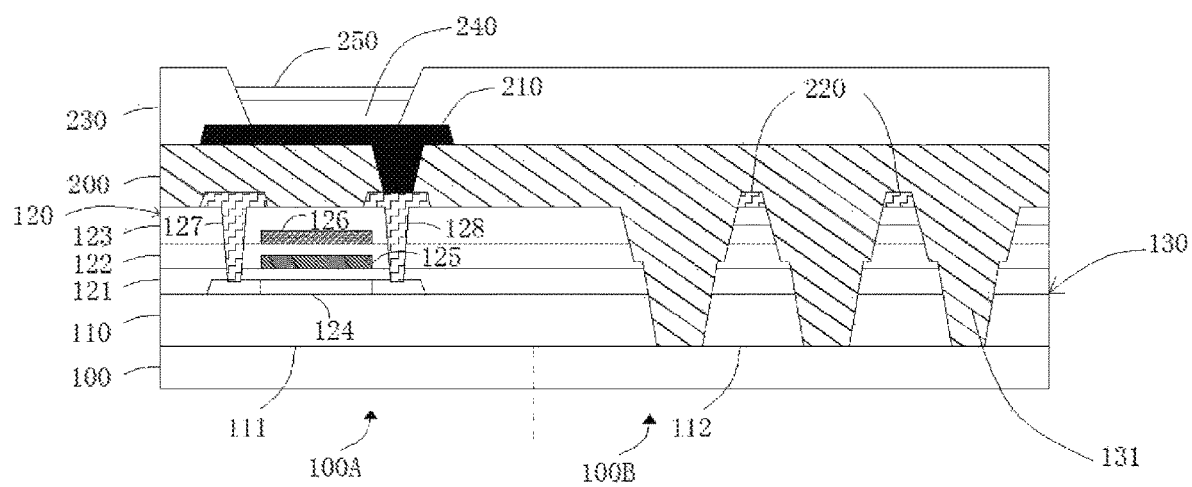
FIG. 4 is a schematic structural diagram of a display panel according to a fourth embodiment of the present invention.

FIG. 4 is a schematic structural diagram of a display panel according to a fourth embodiment of the present invention.

Referring to FIG. 4, the display panel proposed in the fourth embodiment of the present invention is different from the first embodiment, the second embodiment, and the third embodiment in that the third embodiment of the present invention, in the insulated combination layer 130 and the second buffer layer 112, multiple via holes 131 are provided, and the multiple via holes 131 are disposed at intervals.

In this embodiment, the trace 220 is disposed on the interlayer insulation layer 123 between two adjacent via holes 131. In one embodiment of the present invention, two traces 220 are provided. The two traces 220 are distributed on the interlayer insulation layer 121 between the two adjacent via holes 121 of the three via holes 121.

In the embodiment of the invention, the trace 220, the source electrode 127 and the drain electrode 128 are located in the same layer and can be simultaneously manufactured by a same exposure and development process. The via hole 131 does not damage the trace 220, and also removes the material with poor stress and poor flexibility in the bending region 100B, and are replaced by the planarization layer 200 made of organic material, which can increase the stress and flexibility of the display panel in the bending region 100B.

Fifth Embodiment

Figure 5:
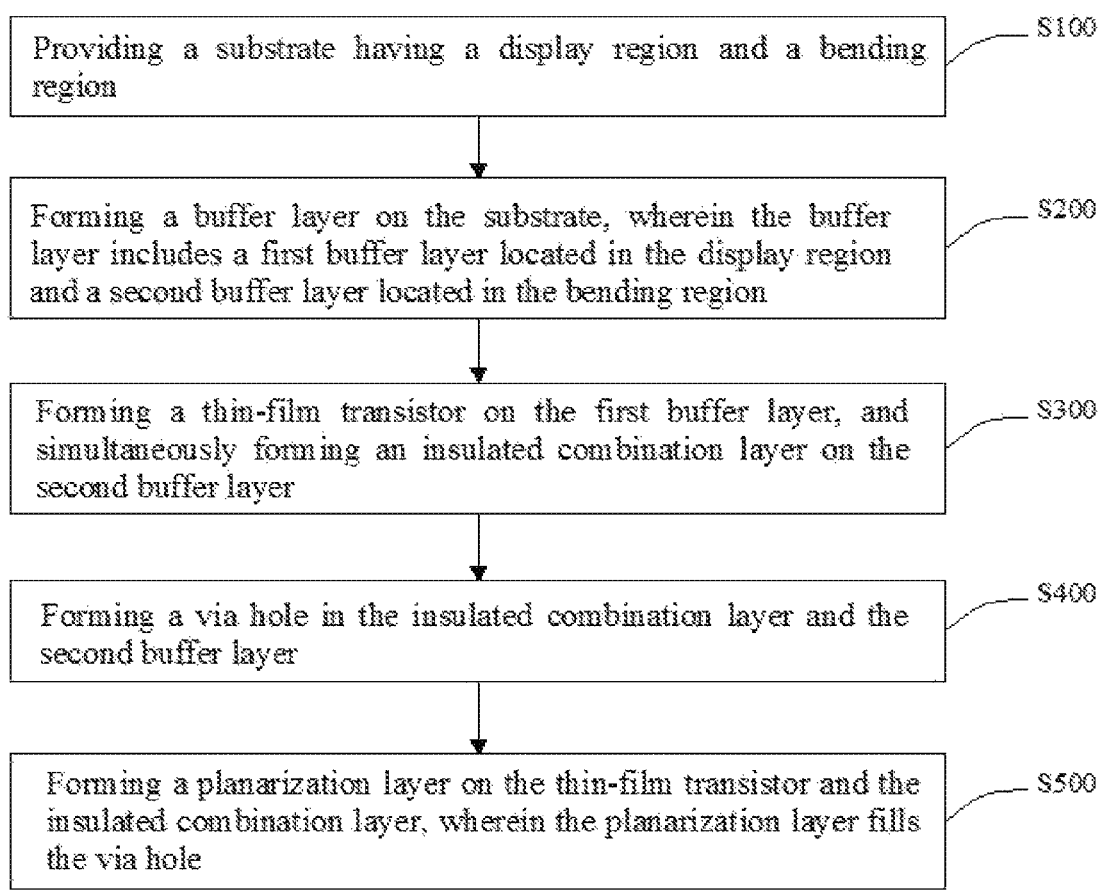
FIG. 5 is a flowchart of a method of manufacturing method for a display panel according to the fourth embodiment of the present invention.

FIG. 5 is a flowchart of a manufacturing method for a display panel according to a fourth embodiment of the present invention.

Referring to FIG. 5, the fourth embodiment of the present invention provides a manufacturing method for a display panel. Specific steps of the manufacturing method for the display panel include:

S100: providing a substrate 100 having a display region 100A and a bending region 100B.

S200: forming a buffer layer 110 on the substrate 100, wherein the buffer layer 110 includes a first buffer layer 111 located in the display region 100A and a second buffer layer 112 located in the bending region 100B;

S300: forming a thin-film transistor 120 on the first buffer layer 111, and simultaneously forming an insulated combination layer 130 on the second buffer layer 112.

S400: forming a via hole 131 in the insulated combination layer 130 and the second buffer layer 112;

S500: forming a planarization layer 200 on the thin-film transistor 120 and the insulated combination layer 130, wherein the planarization layer 200 fills the via hole 131.

Specifically, forming the via hole 131 in the insulated combination layer 130 and the second buffer layer 112 in the step S400, wherein the via hole 131 is formed by two photolithography processes. Since the thickness of the insulated combination layer 130 plus the thickness of the second buffer layer 112 exceeds 1.5 um. If a dry etching process is used, the 1.5 um protective film covered on the effective pattern of other layers will be damaged during the photolithography process, which is not conducive to the protection of the effective pattern. If the protective film is thickened, then the energy of the larger exposure machine is required to remove the protective film. Therefore, the formation of the via hole 131 uses two photolithography processes, which can ensure the protection of the effective pattern and save unnecessary consumption.

Specifically, in step S500, forming a planarization layer 200 on the thin-film transistor 120 and the insulated combination layer 130, wherein the planarization layer 200 fills the via hole 131. In the conventional process, the via hole 131 is first formed, the via hole 131 is filled with an organic material, and then the organic material in the non-via region is removed by exposure and development, and then a planarization layer 200 is formed on the thin-film transistor 120 and the insulated combination layer 130, which results in a more complex process, and the mask required for the exposure process is expensive, resulting in high product costs. However, the planarization layer 200 itself is made of an organic material, and filling the via hole 131 with the planarization layer 200 cannot only ensure the stress and flexibility of the display panel in the bending region 100B, but also reduce the step for removing the organic material in the non-via region by exposure and development. Accordingly, saving the manufacturing process and reduce costs.

As an embodiment of the present invention, the step 300 of forming a thin-film transistor 120 on the first buffer layer 111, and simultaneously forming an insulated combination layer 130 on the second buffer layer 112 includes:

Firstly, forming an active layer 124 on the first buffer layer 111;

next, forming a first insulation layer 121 on the active layer 124 and the first buffer layer 111, wherein the first insulation layer 121 is extended into the bending region 100B;

next, forming a gate electrode 125 on the first insulation layer 121;

next, forming a second insulation layer 122 on the gate electrode 125 and the first insulation layer 121, wherein the second insulation layer 122 is extended into the bending region 100B;

next, forming a capacitor electrode 126 on the second insulating layer 122 and opposite to the gate electrode 125;

next, forming an interlayer insulation layer 123 on the capacitor electrode 126 and the second insulation layer 122, wherein the interlayer insulation layer 123 is extended into the bending region 100B;

Finally, forming a source electrode 127 and a drain electrode 128 on the interlayer insulation layer 123. The source electrode 127 and the drain electrode 128 penetrate the interlayer insulation layer 123, the second insulation layer 122, and the first insulation layer 121 to contact with the active layer 124.

Wherein, the interlayer insulation layer 123, the second insulation layer 122, and the first insulation layer 121 which are extended into the bending region 100B form the insulated combination layer 130.

As an embodiment of the present invention, the steps of the manufacturing method for the display panel further include steps of:

forming an anode 210 on the planarization layer 200 located in the display region 100A;

forming a pixel definition layer 230 on the anode 210 and the planarization layer 200;

forming a pixel definition hole exposing the anode 210 in the pixel definition layer 230;

forming an organic light-emitting layer 240 on the pixel definition layer 230;

forming a cathode 250 on the organic light-emitting layer 240 located in the display region 100A.

In the present embodiment, while the anode 210 is formed on the planarization layer 200 located in the display region 100A, a trace 220 is formed on the planarization layer 200 located in the bending region 100B. The trace 220 is formed simultaneously with the anode 210 by the same exposure and development process.

Sixth Embodiment

The manufacturing method for the display panel proposed in the sixth embodiment of the present invention is different from the fifth embodiment in that the sixth embodiment of the present invention forms the trace 220 on the first insulation layer 121 located in the bending region 100E when performing the step of forming a gate electrode 125 on the first insulation layer 121.

In the present embodiment, the method of forming the via hole 130 in the insulated combination layer 130 and the second buffer layer 112 includes: forming a first via hole 131a in the interlayer insulation layer 123 and the second insulation layer 122 and forming multiple second via holes 131b located in the first insulation layer 121 and the second buffer layer 112 and extended to a bottom of the first via hole 131a.

Seventh Embodiment

The manufacturing method for the display panel proposed in the seventh embodiment of the present invention is different from the fifth embodiment and the sixth embodiment in that the seventh embodiment of the present invention forms the trace 220 on the second insulation layer 122 located at the bending region 100B when performing the step of forming capacitor electrode 126 on the second insulation layer 122.

In the present embodiment, the method of forming the via hole 130 in the insulated combination layer 130 and the second buffer layer 112 includes: forming a first via hole 131a in the interlayer insulation layer 123, and forming multiple second via hole 131b in the second insulation layer 122, the first insulation layer 121 and the second buffer layer 112, and the multiple second via holes 131b are extended to a bottom of the first via hole 131a.

Eighth Embodiment

The manufacturing method for the display panel proposed in the eighth embodiment of the present invention is different from the fifth embodiment, the sixth embodiment, and the seventh embodiment in that the eighth embodiment of the present invention form traces 220 on the interlayer insulation layer 123 in the bending region 100B when performing the step of forming a source electrode 127 and a drain electrode 128 on the interlayer insulation layer 123.

In the present embodiment, the method of forming the vias hole 130 in the insulated combination layer 130 and the second buffer layer 112 includes forming multiple separated via holes 130 in the insulated combination layer 130 and the second buffer layer 112.

In the present invention, the organic planarization layer 200 is used to fill the via hole 130, and the flexibility of the display panel located in the bending region 100B can be ensured while the process flow can be simplified and the production cost can be reduced.

Although the present invention has been shown and described with reference to specific embodiments, it will be understood by those skilled in the art that various forms and details may be carried out without departing from the spirit and scope of the present invention defined by the claims and their equivalents.

What is claimed is:

1. A display panel, comprising:
    a substrate having a display region and a bending region;
    a buffer layer having a first buffer layer disposed in the display region and a second buffer layer disposed in the bending region;
    a thin-film transistor disposed on the first buffer layer;
    an insulated combination layer disposed in the second buffer layer, a via hole is provided in the insulated combination layer and the second buffer layer; and
    a planarization layer disposed on the thin-film transistor and the insulated combination layer, and the planarization layer fills the via hole.

2. The display panel according to claim 1, wherein the thin-film transistor comprises:
    an active layer disposed on the first buffer layer;
    a first insulation layer disposed on the active layer and the first buffer layer, and the first insulation layer is extended into the bending region;
    a gate electrode disposed on the first insulation layer;
    a second insulation layer disposed on the gate electrode and the first insulation layer, and the second insulation layer is extended into the bending region;
    a capacitor electrode disposed on the second insulation layer and is opposite to the gate electrode;
    an interlayer insulation layer disposed on the capacitor electrode and the second insulation layer, and the interlayer insulation layer is extended into the bending region;
    a source electrode and a drain electrode disposed on the interlayer insulation layer, wherein the source electrode and the drain electrode penetrate the interlayer insulation layer, the second insulation layer, and the first insulation layer to respectively contact with the active layer;
    wherein the insulated combination layer is formed by the interlayer insulation layer, the second insulation layer, and the first insulation layer extended to the bending region.

3. The display panel according to claim 1, wherein the display panel further includes a trace disposed on the planarization layer in the bending region.

4. The display panel according to claim 2, wherein the display panel further includes a trace disposed on the planarization layer in the bending region.

5. The display panel according to claim 2, wherein the via hole includes a first via hole that penetrates the interlayer insulation layer and the second insulation layer and multiple second via holes that penetrate the first insulation layer and the second buffer layer by extending from a bottom of the first via hole;
    wherein the display panel further includes a trace disposed on the first insulation layer between two adjacent second vias holes.

6. The display panel according to claim 2, wherein the via hole includes a first via hole that penetrates the interlayer insulation layer and multiple second via holes that penetrates the second insulation layer, the first insulation layer, and the second buffer layer by extending from the bottom of the first via hole;
    wherein the display panel further includes a trace disposed on the second insulation layer between two adjacent second vias holes.

7. The display panel according to claim 1, wherein the display panel further comprises:
    an anode disposed on the planarization layer, and the anode penetrates the planarization layer to connect with the thin-film transistor;
    a pixel definition layer disposed on the anode and the planarization layer, wherein the pixel definition layer has a pixel definition hole exposing the anode;
    an organic light-emitting layer disposed on the anode; and
    a cathode disposed on the organic light-emitting layer.

8. A manufacturing method for a display panel, comprising steps of:
    providing a substrate having a display region and a bending region;
    forming a buffer layer on the substrate, wherein the buffer layer includes a first buffer layer located in the display region and a second buffer layer located in the bending region;
    forming a thin-film transistor on the first buffer layer, and simultaneously forming an insulated combination layer on the second buffer layer;
    forming a via hole in the insulated combination layer and the second buffer layer; and
    forming a planarization layer on the thin-film transistor and the insulated combination layer, wherein the planarization layer fills the via hole.

9. The manufacturing method for a display panel according to claim 8, wherein the step of forming a thin-film transistor on the first buffer layer comprises steps of:
    forming an active layer on the first buffer layer;
    forming a first insulation layer on the active layer and the first buffer layer, wherein the first insulation layer is extended into the bending region;
    forming a gate electrode on the first insulation layer;
    forming a second insulation layer on the gate electrode and the first insulation layer, wherein the second insulation layer is extended into the bending region;
    forming a capacitor electrode on the second insulating layer and opposite to the gate electrode;
    forming an interlayer insulation layer on the capacitor electrode and the second insulation layer, wherein the interlayer insulation layer is extended into the bending region;
    forming a source electrode and a drain electrode on the interlayer insulation layer, wherein the source electrode and the drain electrode penetrate the interlayer insulation layer, the second insulation layer, and the first insulation layer to contact with the active layer;

wherein, the interlayer insulation layer, the second insulation layer, and the first insulation layer which are extended into the bending region form the insulated combination layer.

10. The manufacturing method for a display panel according to claim 8, wherein the method further comprises a step of forming a trace on the planarization layer located in the bending region.

11. The manufacturing method for a display panel according to claim 9, wherein the method further comprises a step of forming a trace on the planarization layer located in the bending region.

12. The manufacturing method fora display panel according to claim 9, wherein the method further comprises steps of:
when performing the step of forming a gate electrode on the first insulation layer, forming the trace on the first insulation layer located in the bending region;
the method of forming the via hole in the insulated combination layer and the second buffer layer includes: forming a first via hole in the interlayer insulation layer and the second insulation layer, and forming multiple second via holes located in the first insulation layer and the second buffer layer and extended to a bottom of the first via hole.

13. The manufacturing method for a display panel according to claim 9, wherein the method further comprises steps of:
when performing the step of forming capacitor electrode on the second insulation layer, forming the trace on the second insulation layer located at the bending region;
the method of forming the via hole in the insulated combination layer and the second buffer layer includes: forming a first via hole in the interlayer insulation layer, and forming multiple second via hole in the second insulation layer, the first insulation layer and the second buffer layer, and the multiple second via holes are extended to a bottom of the first via hole.

\* \* \* \* \*